(12) United States Patent
Terasawa

(10) Patent No.: US 8,680,933 B2
(45) Date of Patent: Mar. 25, 2014

(54) TEMPERATURE-COMPENSATED OSCILLATOR AND ELECTRONIC DEVICE

(75) Inventor: Katsuyoshi Terasawa, Shiojiri (JP)

(73) Assignee: Seiko Epson Corporation (JP)

( * ) Notice: Subject to any disclaimer, the term of this patent is extended or adjusted under 35 U.S.C. 154(b) by 17 days.

(21) Appl. No.: 13/462,148

(22) Filed: May 2, 2012

(65) Prior Publication Data

US 2012/0286890 A1 Nov. 15, 2012

(30) Foreign Application Priority Data

May 13, 2011 (JP) ................................ 2011-108762

(51) Int. Cl.
*H03L 1/00* (2006.01)
*H03B 5/32* (2006.01)

(52) U.S. Cl.
USPC ........................... 331/176; 331/158; 331/186

(58) Field of Classification Search
USPC .......... 310/315, 346; 331/154, 156, 158, 176, 331/186
See application file for complete search history.

(56) References Cited

U.S. PATENT DOCUMENTS

| 5,548,252 | A | * | 8/1996 | Watanabe et al. ............. 331/176 |
| 5,668,506 | A | * | 9/1997 | Watanabe et al. ............... 331/66 |
| 5,801,594 | A | * | 9/1998 | Muto et al. ..................... 331/158 |
| 5,874,864 | A | * | 2/1999 | Muto et al. ....................... 331/66 |
| 5,892,408 | A | * | 4/1999 | Binder ............................. 331/44 |
| 5,977,840 | A | * | 11/1999 | Connell et al. ................ 331/158 |
| 6,292,066 | B1 | * | 9/2001 | Shibuya et al. ............... 331/176 |
| 6,366,175 | B2 | * | 4/2002 | Oka ........................... 331/116 R |
| 6,771,135 | B2 | * | 8/2004 | Kubo et al. ...................... 331/66 |
| 6,882,835 | B2 | * | 4/2005 | Oka et al. ....................... 455/260 |
| 2011/0273333 | A1 | * | 11/2011 | Terasawa et al. ......... 342/357.77 |
| 2012/0262244 | A1 | * | 10/2012 | Terasawa ....................... 331/167 |

FOREIGN PATENT DOCUMENTS

| JP | 62-038605 | 2/1987 |
| JP | 02-141026 | 5/1990 |
| JP | 2003-008348 | 1/2003 |
| JP | 2003-258551 | 9/2003 |
| JP | 2007-208584 | 8/2007 |

* cited by examiner

*Primary Examiner* — Levi Gannon
(74) *Attorney, Agent, or Firm* — Harness, Dickey & Pierce, P.L.C.

(57) ABSTRACT

A temperature-compensated oscillator includes a temperature sensor, a temperature compensation circuit, a voltage-controlled oscillation circuit adapted to output an oscillation signal on which temperature compensation is performed based on the temperature compensation voltage, an output circuit adapted to output an ON/OFF signal based on a relationship between variation of the detected-temperature voltage output by the temperature sensor and a reference voltage, a switch circuit adapted to supply the temperature compensation circuit with electrical power in response to the ON/OFF signal, and a sample-and-hold circuit adapted to be switched between a state of outputting the temperature compensation voltage to the voltage-controlled oscillation circuit while holding the temperature compensation voltage output by the temperature compensation circuit, and a state of outputting the temperature compensation voltage held to the voltage-controlled oscillation circuit while cutting the connection to the temperature compensation circuit in response to the ON/OFF signal.

9 Claims, 11 Drawing Sheets

TEMPERATURE-COMPENSATED OSCILLATOR AND ELECTRONIC DEVICE

BACKGROUND

1. Technical Field

The present invention relates to a temperature-compensated oscillator allowing reduction of power consumption while keeping the accurate temperature compensation, and an electronic device equipped with the temperature-compensated oscillator.

2. Related Art

In the past, a crystal oscillator such as a temperature-compensated crystal oscillator (TCXO), which is less susceptible to ambient temperature and inherent characteristics of electrical components, and is superior as a stable oscillation circuit, has been used as a reference clock source of an electronic device such as a microcomputer or a cellular phone.

FIG. 11 shows a temperature-compensated crystal oscillator described in JP-A-2003-258551 (Document 1). As shown in FIG. 11, the temperature-compensated oscillator 200 is composed of an oscillation circuit 202 and a temperature compensation circuit 206. The oscillation circuit 202 has a structure in which a plurality of series circuits each composed of a switch Sn (n denotes a natural number) and a capacitor Cn (n denotes a natural number) is connected to a circuit including a crystal resonator 204 as an oscillation source, and by setting the switches Sn to ON/OFF, it is possible to vary the capacitance inside the oscillation circuit 202 to thereby control the oscillation frequency of the oscillation signal. On the other hand, the temperature compensation circuit 206 selects a correction value for controlling the frequency so as to reduce the variation in the oscillation frequency of the crystal resonator 204 due to the temperature variation based on the temperature information obtained by a temperature sensor 208, and then outputs signals for switch control according to the correction value to the oscillation circuit 202. Further, it results that in the oscillation circuit 202, the switches S1, ... , Sn are individually switched ON/OFF in accordance with the signals for switch control input thereto.

In the temperature-compensated crystal oscillator described in JP-A-62-38605 (Document 2), although being composed of the oscillation circuit and the temperature compensation circuit, the oscillation circuit is provided with a varactor diode with a capacity varying in accordance with the voltage applied thereto, and the temperature compensation circuit outputs a control signal for controlling the capacitance value of the varactor diode so as to reduce the frequency variation of the crystal resonator due to the temperature variation to thereby vary the frequency. Thus, the oscillation circuit applies the voltage corresponding to the control signal to the varactor diode.

Therefore, in the temperature-compensated crystal oscillator described in Document 1 or 2, it results that the capacitance inside the oscillation circuit has opposite temperature characteristics to the temperature characteristics of the oscillation frequency of the crystal resonator.

Therefore, the temperature-compensated crystal oscillator of Document 1 or 2 is capable of reducing the variation in the temperature characteristics of the oscillation frequency of the crystal resonator with the frequency variation due to the variation in the capacitance inside the oscillation circuit to thereby output the oscillation signal having temperature characteristics of low temperature dependency, a similar technology to which is also disclosed in JP-A-2007-208584 (Document 3).

In such temperature-compensated oscillator, there is a problem of reducing the power consumption while keeping the accurate temperature compensation. In Document 1 and JP-A-2-141026 (Document 4), there is disclosed a technology of decreasing the interval between the timings of generating the temperature compensation voltage when the temperature variation is great and increasing it when the temperature variation is small by contraries, and in Document 3, there is adopted a configuration of driving the temperature compensation circuit in the case in which the frequency of the oscillation signal runs off a certain allowable range centered on the reference frequency.

However, in the temperature-compensated crystal oscillator of Documents 1 and 3, there are a problem that the frequency changes rapidly due to the change in the capacitance since the change in the capacitance is discrete, and a problem that the cost is too high since it is required to increase the number of capacitors in order to improve the accuracy of the temperature compensation.

Further, since the temperature-compensated crystal oscillator of Document 2 monitors the actual frequency variation to thereby determine whether or not the temperature compensation is to be performed, there is a problem that the configuration for detecting the frequency becomes necessary, which increases the cost.

Further, in Documents 1, 3, and 4, although reduction in power consumption is achieved by changing the period of the timing of outputting the temperature compensation voltage, there is a problem that there is a limitation in reduction in power consumption since the temperature compensation circuit is driven continuously.

SUMMARY

An advantage of some aspects of the invention is to provide a temperature-compensated oscillator allowing reduction in power consumption with a simple configuration while keeping the accurate temperature compensation, and an electronic device equipped with the temperature-compensated oscillator.

Application Example 1

This application example of the invention is directed to a temperature-compensated oscillator including a temperature sensor adapted to output a detected-temperature voltage corresponding to temperature, a temperature compensation circuit adapted to output a temperature compensation voltage based on the detected-temperature voltage, and a voltage-controlled oscillation circuit adapted to output an oscillation signal having an oscillation frequency on which a temperature compensation is performed based on the temperature compensation voltage input, and further includes an output circuit adapted to output an ON/OFF signal based on a magnitude relation between an amplitude of a voltage variation in the detected-temperature voltage in a desired period and a reference voltage, a switch circuit capable of performing ON/OFF control on power supply to the temperature compensation circuit in response to the ON/OFF signal, and a sample-and-hold circuit which can be controlled to be switched between a state of outputting the temperature compensation voltage to the voltage-controlled oscillation circuit while connecting to the temperature compensation circuit, and holding the temperature compensation voltage output by the temperature compensation circuit, and a state of outputting the temperature compensation voltage held to the voltage-controlled oscillation circuit while cutting the connection to the temperature compensation circuit in response to the ON/OFF signal.

According to the configuration described above, it is possible to determine whether or not the temperature compensation is to be performed based on the amplitude of the voltage variation of the detected-temperature voltage detected by the temperature sensor, drive the temperature compensation circuit to output the temperature compensation voltage to the voltage-controlled oscillation circuit, and at the same time hold the temperature compensation voltage in the sample-and-hold circuit if the amplitude of the voltage variation is greater than the reference voltage, and stop to drive the temperature compensation circuit and output the temperature compensation voltage held by the sample-and-hold circuit to the voltage-controlled oscillation circuit if the amplitude of the voltage variation is smaller than the reference voltage. Therefore, a temperature-compensated oscillator allowing reduction of power consumption with a simple configuration while keeping the accurate temperature compensation can be obtained.

Application Example 2

This application example of the invention is directed to the temperature-compensated oscillator according to Application Example 1, wherein the output circuit includes a low-pass filter to which the detected-temperature voltage is input, a differential amplifier circuit adapted to perform differential amplification on an output of the temperature sensor and an output of the low-pass filter to thereby output a voltage corresponding to the voltage variation, an absolute value circuit adapted to output a voltage representing an absolute value of an output of the differential amplifier circuit to thereby output a voltage corresponding to an amplitude of the voltage variation, and a comparator adapted to output a signal, which represents a magnitude relation between an output of the absolute value circuit and the reference voltage, as the ON/OFF signal.

According to the configuration described above, since it results that the low-pass filter outputs the detected-temperature voltage a certain period of time before the present, the absolute value circuit can calculate the amplitude of the difference between the present detected-temperature voltage and the detected-temperature voltage a certain period of time before the present, namely the amplitude of the voltage variation in the detected-temperature voltage. Therefore, the ON/OFF signal can be output while calculating the amplitude of the voltage variation in the detected-temperature voltage with a simple configuration.

Application Example 3

This application example of the invention is directed to the temperature-compensated oscillator according to Application Example 1, the output circuit includes a timer adapted to output a drive signal at a constant period, a second sample-and-hold circuit which can be switched between a state of outputting the detected-temperature voltage while connecting to the temperature sensor, and holding the detected-temperature voltage, and a state of outputting the detected-temperature voltage held while cutting the connection with the temperature sensor, a differential amplifier circuit adapted to perform differential amplification on an output of the temperature sensor and an output of the second sample-and-hold circuit to thereby output a voltage corresponding to the voltage variation, an absolute value circuit adapted to output a voltage representing an absolute value of an output of the differential amplifier circuit to thereby output a voltage corresponding to an amplitude of the voltage variation, and a comparator adapted to output a signal, which represents a magnitude relation between an output of the absolute value circuit and the reference voltage, as the ON/OFF signal.

According to the configuration described above, by varying the period of the timer, the interval of calculation of the amplitude of the voltage variation in the detected-temperature voltage can arbitrarily be set.

Application Example 4

This application example of the invention is directed to the temperature-compensated oscillator according to Application Example 2 or 3, the output circuit includes a blocking circuit adapted to block the ON/OFF signal if the detected-temperature voltage is a value between a first threshold voltage previously set, and a second threshold voltage set previously and higher than the first threshold voltage.

In the configuration described above, by, for example, setting the range between the temperature corresponding to the first threshold voltage and the temperature corresponding to the second threshold voltage so as to correspond to the area (the area corresponding to an extremal value of the frequency-temperature characteristic curve and the temperature range in the vicinity thereof, where the variation in the frequency-temperature characteristic in the temperature range is within the stability of the frequency-temperature characteristic required for the temperature-compensated oscillator) where the temperature characteristic of the oscillation frequency of the voltage-controlled oscillation circuit is roughly flat, it becomes unnecessary to drive the temperature compensation circuit since the update of the temperature compensation voltage is unnecessary in that temperature range. Therefore, if the temperature detected by the temperature sensor is in that temperature range, it is possible to stop to drive the temperature compensation circuit to thereby dramatically reduce the power consumption.

Application Example 5

This application example of the invention is directed to the temperature-compensated oscillator according to any one of Application Examples 2 through 4, the output circuit includes a delay circuit to which the ON/OFF signal is input, and which outputs a delay signal obtained by delaying a voltage variation in the ON/OFF signal, an OR circuit adapted to output a signal representing an OR result between the ON/OFF signal and the delay signal to the switch circuit as the ON/OFF signal, and an AND circuit adapted to output a signal representing an AND result between the ON/OFF signal and the delay signal to the sample-and-hold circuit as the ON/OFF signal.

According to the configuration described above, the rising of the drive of the sample-and-hold circuit becomes later than the rising of the drive of the temperature compensation circuit, and the falling of the drive of the sample-and-hold circuit becomes earlier than the falling of the drive of the temperature compensation circuit. Therefore, since it is possible for the temperature compensation circuit to stabilize the output of the temperature compensation voltage in a period before the sample-and-hold circuit is started up, and the sample-and-hold circuit is halted before the temperature compensation circuit is stopped, it is possible to reliably hold the temperature compensation voltage output from the temperature compensation circuit.

Application Example 6

This application example of the invention is directed to the temperature-compensated oscillator according to any one of Application Examples 1 through 5, there is further provided a second low-pass filter disposed one of between the temperature compensation circuit and the sample-and-hold circuit, and between the sample-and-hold circuit and the voltage-controlled oscillation circuit.

It results that the sample-and-hold circuit switches from the temperature compensation voltage held to the temperature compensation voltage newly input from the temperature compensation circuit immediately after setting the temperature compensation circuit to the ON state. Therefore, the temperature compensation voltage becomes discontinuous in the time direction at the switching, which might exert a harmful influence to the voltage-controlled oscillator circuit. Therefore, by adopting the configuration described above, it is possible to make the time variation in the temperature compensation voltage newly input thereto gentle to thereby reduce the load on the voltage-controlled oscillation circuit.

Application Example 7

This application example of the invention is directed to an electronic device including the temperature-compensated oscillator according to any one of Application Examples 1 through 6.

According to the configuration described above, an electronic device allowing reduction of power consumption with a simple configuration while keeping the accurate temperature compensation can be obtained.

BRIEF DESCRIPTION OF THE DRAWINGS

The invention will be described with reference to the accompanying drawings, wherein like numbers reference like elements.

FIGS. 9A and 9B are diagrams showing a modified examples of the temperature-compensated oscillator according to the present embodiment, wherein FIG. 9A is a diagram having a low-pass filter disposed between a temperature compensation circuit and a sample-and-hold circuit, and FIG. 9B is a diagram having a low-pass filter disposed between the sample-and-hold circuit and a voltage-controlled oscillation circuit.

DESCRIPTION OF AN EXEMPLARY EMBODIMENT

Hereinafter, an embodiment of the invention shown in the accompanying drawings will be explained in detail. It should be noted that constituents, types, combinations, shapes, relative arrangements thereof, and so on described in the present embodiments are not intended to limit the scope of the invention only thereto and are nothing more than mere explanatory examples unless specifically described.

Figure 1:
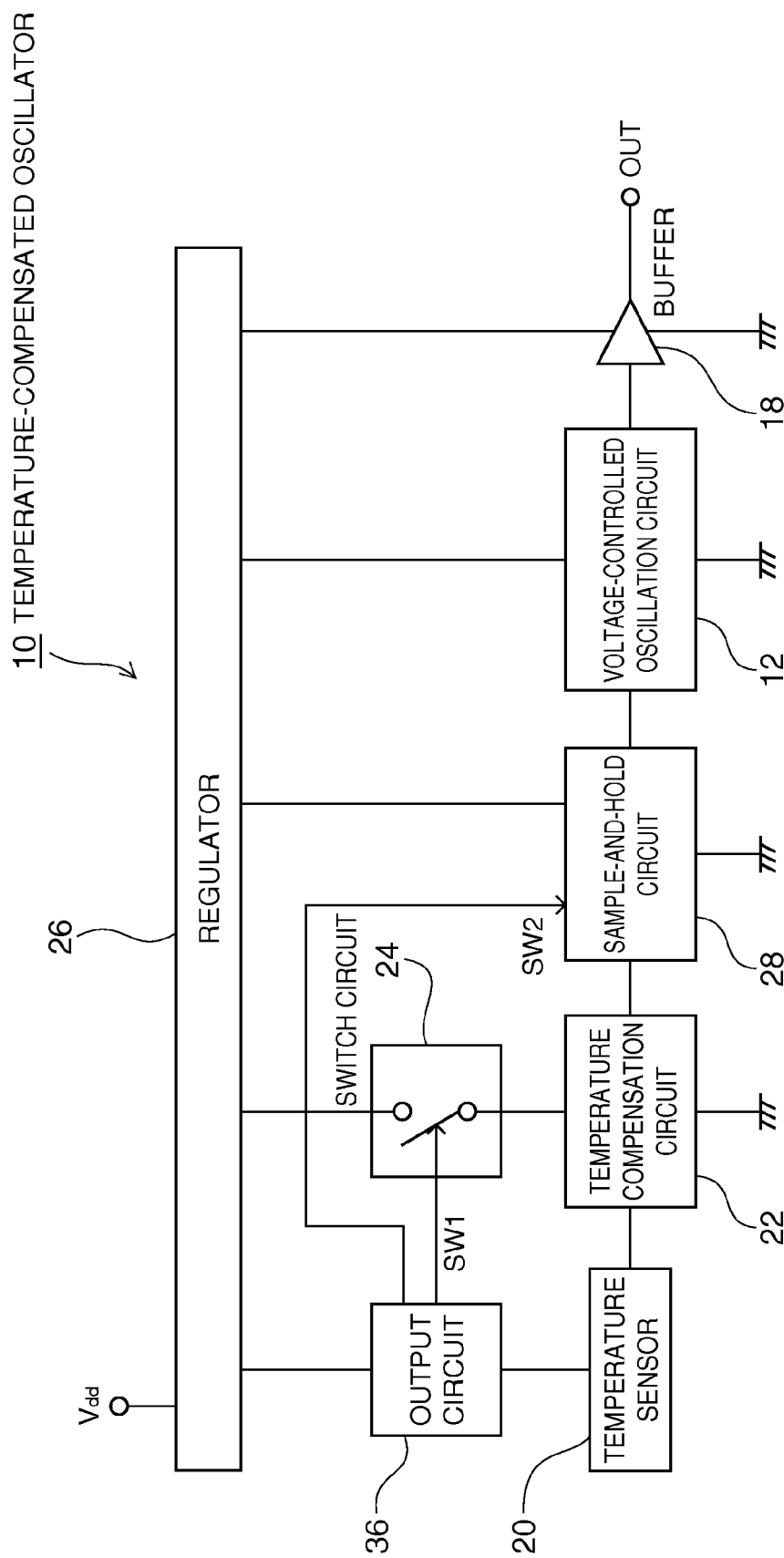
FIG. 1 is a general block diagram of a temperature-compensated oscillator according to an embodiment of the invention.

FIG. 1 shows a general block diagram of a temperature-compensated oscillator according to the present embodiment. The temperature-compensated oscillator 10 according to the present embodiment has a configuration having a temperature sensor 20, a temperature compensation circuit 22, a sample-and-hold circuit 28, a voltage-controlled oscillation circuit 12, and a buffer 18 all connected in series in this order, and further has a regulator (a constant voltage output circuit) 26 for supplying these constituents and an output circuit 36 described later with a constant voltage (electrical power). Further, a switch circuit 24 is connected between the regulator 26 and the temperature compensation circuit 22, and the output circuit 36 for outputting a first ON/OFF signal (SW1) to the switch circuit 24, and outputting a second ON/OFF signal (SW2) to the sample-and-hold circuit 28 is further provided.

It should be noted that, as described later, the ON/OFF signals denote switching control signals for continuously and repeatedly performing switching between connection and disconnection between input and output terminals of the switch circuit 24, and switching between connection and disconnection between input and output terminals of the sample-and-hold circuit 28, respectively.

Figure 2:
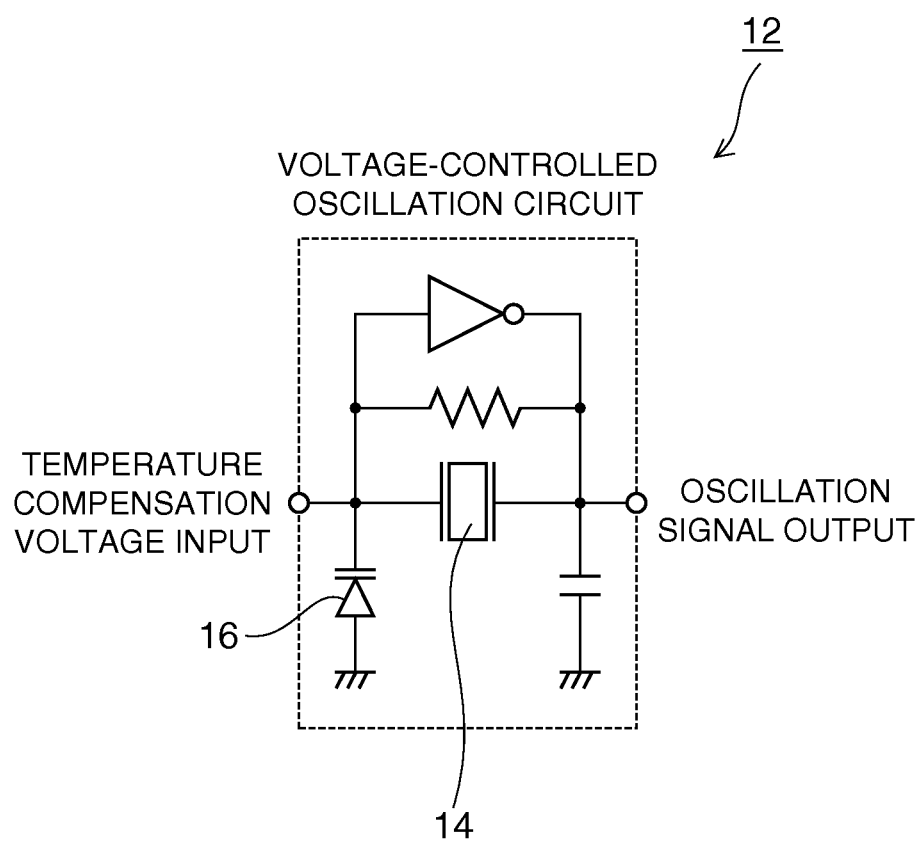
FIG. 2 is a circuit diagram of a voltage-controlled oscillation circuit according to the present embodiment.

FIG. 2 shows a circuit diagram of the voltage-controlled oscillation circuit 12 according to the present embodiment. The voltage-controlled oscillation circuit 12 is, for example, a Colpitts oscillation circuit, and has a piezoelectric resonator 14 as an oscillation source. As the piezoelectric resonator 14, for example, a thickness-shear resonator and a tuning-fork type resonator each formed of a quartz crystal can be used. Further, by applying an alternating-current voltage to the piezoelectric resonator 12, the oscillation signal can be output at a predetermined resonant frequency (oscillation frequency). Further, the voltage-controlled oscillation circuit 12 incorporates the varactor diode 16 having a variable capacitance. In the voltage-controlled oscillation circuit 12, by varying the voltage (the temperature compensation voltage) applied to the varactor diode 16, the capacitance of the varactor diode 16 varies, and the oscillation frequency of the oscillation signal varies due to the capacitance variation. It should be noted that the buffer 18 is a circuit having an extremely high input impedance, and is capable of transmitting only the voltage of the oscillation signal, which is output from the voltage-controlled oscillation circuit 12, to a destination device connected thereto. Thus, the voltage-controlled oscillation circuit 12 can output the oscillation signal without being affected by the destination device connected thereto.

Since the resonant frequency of the piezoelectric resonator 14 varies due to the temperature variation, the oscillation frequency of the oscillation signal reflects the temperature characteristics of the resonant frequency of the piezoelectric resonator 14, and can vary due to the temperature variation. Therefore, since the temperature compensation voltage for canceling out (suppressing the variation range of the oscillation frequency caused by the influence of the temperature characteristics of the piezoelectric resonator 14 to a narrow range) the temperature characteristics of the piezoelectric resonator 14 is applied to the varactor diode 16, the oscillation frequency of the oscillation signal becomes to have temperature characteristics compensated to have a frequency deviation range narrower then that of the temperature characteristics of the piezoelectric resonator 14 with respect to the temperature variation.

As shown in FIG. 1, the temperature sensor 20 is for outputting a detected-temperature voltage (temperature detection signal) corresponding to the temperature measured to the temperature compensation circuit 22, and is formed of a diode or the like. In the case of forming the temperature sensor 20 with a diode, a forward current is applied to the diode, and then the detected-temperature voltage (V0) dropping in a linear function manner with the temperature is output to the temperature compensation circuit 22.

The detected-temperature voltage is input to the temperature compensation circuit 22 from the temperature sensor 20, and then the temperature compensation circuit 22 outputs the temperature compensation voltage corresponding to the voltage to the sample-and-hold circuit 28. If the piezoelectric resonator 14 of the present embodiment is a tuning-fork type resonator, the temperature characteristics of the resonant frequency thereof can be drawn as a curve shaped like a quadratic curve, and if the piezoelectric resonator 14 is a thickness-shear vibrator, the temperature characteristics thereof can be drawn as a curve shaped like a cubic curve. Therefore, the information of the temperature coefficients such as zero-order, first-order, second-order, and third-order temperature coefficients for approximating the temperature characteristics of the resonant frequency of the piezoelectric resonator 22 is previously input to the temperature compensation circuit 22. Therefore, using the information of the temperature as a variable, the temperature compensation circuit 22 calculates the temperature compensation voltage based on the information of the resonant frequency at the temperature of the piezoelectric resonator 14 thus measured obtained by calculating the power series using these temperature coefficients as the coefficients, and then outputs the temperature compensation voltage to the sample-and-hold circuit 28.

The switch circuit 24 is connected between the regulator 26 and the temperature compensation circuit 22, and performs ON/OFF control of the power, which the temperature compensation circuit 22 is supplied with by the regulator 26. The switch circuit 24 performs the ON/OFF control of the temperature compensation circuit 22 in accordance with the first ON/OFF signal (SW1) input from the output circuit 36, wherein the temperature compensation circuit 22 is set to an ON state (a conduction state) if the voltage of the first ON/OFF signal (SW1) is H (a voltage higher than a reference value), and the temperature compensation circuit 22 is set to an OFF state (a non-conduction state) if the voltage of the first ON/OFF signal (SW1) is L (a voltage lower than the reference value).

Figure 3:
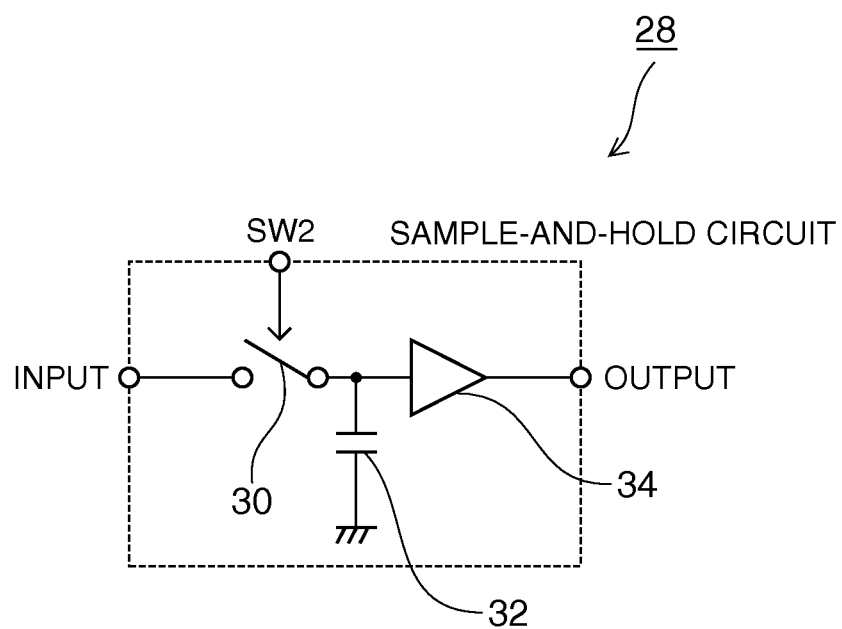
FIG. 3 is a circuit diagram of a sample-and-hold circuit according to the present embodiment.

FIG. 3 shows a circuit diagram of the sample-and-hold circuit according to the present embodiment. The sample-and-hold circuit 28 performs the control of switching between a state (a direct output state) of outputting the temperature compensation voltage to the voltage-controlled oscillation circuit 12 while connecting to the temperature compensation circuit to thereby hold the temperature compensation voltage output from the temperature compensation circuit 22, and a sate (a sample-and-hold (S/H) output state) of outputting the temperature compensation voltage thus held to the voltage-controlled oscillation circuit 12 while cutting the connection to the temperature compensation circuit 22.

The sample-and-hold circuit 28 is composed of a switch 30, a capacitor 32, and a buffer 34, and an input end of the buffer 34 is connected to an output side of the switch 30, and the capacitor 32 is connected between the input end of the buffer 34 and the ground. Switching control of the switch 30 is performed in accordance with the second ON/OFF signal (SW2) supplied from the output circuit 36. Specifically, the switch 30 is set to the ON state (the conduction state) if the voltage of the second ON/OFF signal (SW2) is H (the voltage higher than the reference value), and the switch 30 is set to the OFF state (the non-conduction state) if the voltage of the second ON/OFF signal (SW2) is L (the voltage lower than the reference value). Therefore, the sample-and-hold circuit 28 is set to the direct output state in the ON state, and is set to the sample-and-hold (S/H) output state in the OFF state.

Figure 4:
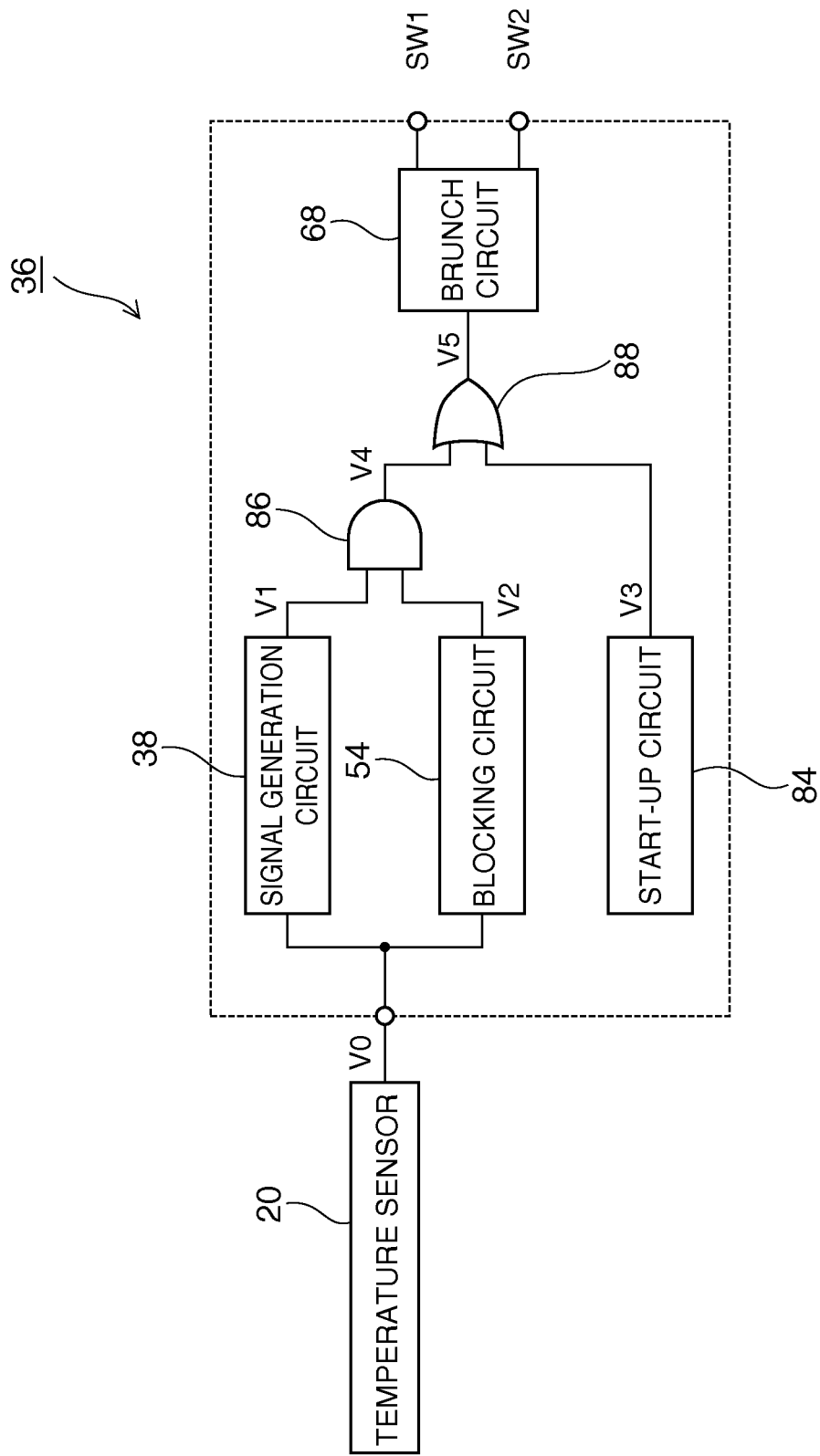
FIG. 4 is a block diagram of an output circuit according to the present embodiment.

FIG. 4 shows a block diagram of the output circuit according to the present embodiment. The output circuit 36 is for generating the first ON/OFF signal (SW1) and the second ON/OFF signal (SW2), and is composed of a signal generation circuit 38, a blocking circuit 54, a start-up circuit 84, a brunch circuit 68, and so on.

The signal generation circuit 38 outputs a signal (V1) with the voltage H (the voltage higher than the reference value) if the variation width (the amplitude of the voltage variation) of the detected-temperature voltage (V0) input from the temperature sensor 20 exceeds a certain value, and outputs a signal (V1) with the voltage L (the voltage lower than the reference value) if it does not exceed the value.

The blocking circuit 54 is for outputting a signal (V2) with the voltage L if the detected-temperature voltage (V0) input from the temperature sensor 20 is in a certain range, and outputting a signal with the voltage H if it is out of the range. On other wards, the blocking circuit 54 is set so as to output the signal (V2) with the voltage L if the temperature measured by the temperature sensor 20 is in a desired temperature range, and output the signal with the voltage H if it is out of the temperature range.

The start-up circuit 84 is for outputting a signal (V3) with the voltage H for a certain period of time when the temperature-compensated oscillator 10 (e.g., the regulator 26) according to the present embodiment is started up, and thereafter outputting the signal (V3) with the voltage L.

The AND circuit 86 is for outputting a signal (V4) representing the AND result between the signal (V1) output from the signal generation circuit 38 and the signal (V2) output from the blocking circuit 54.

The OR circuit 88 is for outputting a signal (V5) representing the OR result between the signal (V4) output from the AND circuit 86 and the signal (V3) output from the start-up circuit 84.

The branch circuit 68 is for outputting the first ON/OFF signal (SW1) and the second ON/OFF signal (SW2) each having the voltage H if the signal (V5) output from the OR circuit 88 has the voltage H, and outputting the first ON/OFF signal (SW1) and the second ON/OFF signal (SW2) each having the voltage L if the signal (V5) has the voltage L by contraries.

Therefore, until the certain time elapses after the temperature-compensated oscillator 10 according to the present embodiment is started up, the voltage of the signal (V3) is kept in H, and the voltage of the signal (V5) is set to H. Further, the voltage of the first ON/OFF signal (SW1) and the second ON/OFF signal (SW2) output from the brunch circuit 68 is set to H irrespective of the signals (V1), (V2), and (V4). Therefore, since the switch circuit 24 receives the first ON/OFF signal (SW1) with the voltage H is set to the ON state, the temperature compensation circuit 22 is supplied with the electrical power by the regulator 26 and driven, and the sample-and-hold circuit 28 receiving the second ON/OFF signal (SW2) with the voltage H is set to the direct output state. By driving the temperature compensation circuit 22 during the certain period after the start-up as described above, it is possible to output the temperature compensation voltage to the voltage-controlled oscillation circuit 12 from the start-up to thereby perform the temperature compensation of the oscillation signal, and at the same time, to make the sample-and-hold circuit 28 hold the temperature compensation voltage output from the temperature compensation circuit 22.

Then, after the certain period has elapsed, the voltage of the signal (V3) is set to L. However, if the signal (V1) and the signal (V2) have the voltage H, the voltage of the signal (V4) is set to H, and therefore the voltage of the signal (V5) is set to H, and the voltage of the first ON/OFF signal (SW1) and the voltage of the second ON/OFF signal (SW2) are set to H. In contrast, if at least either one of the signal (V1) and the signal (V2) have the voltage L, the voltage of the signal (V4) is set to L, and therefore the voltage of the signal (V5) is also set to L, and the voltage of the first ON/OFF signal (SW1) and the voltage of the second ON/OFF signal (SW2) are set to L.

In other words, if the temperature measured by the temperature sensor 20 is out of the temperature range, which is set as a requirement for the blocking circuit 54 to output the voltage L, and the temporal variation (the amplitude of the voltage variation in the detected-temperature voltage) of the temperature measured by the temperature sensor 20 exceeds the variation (the reference voltage) set by the signal generation circuit 38, the voltage of the signal (V5) is set to H. In contrast, if these conditions are not fulfilled, the voltage of the signal (V5) is set to L.

Figure 5:
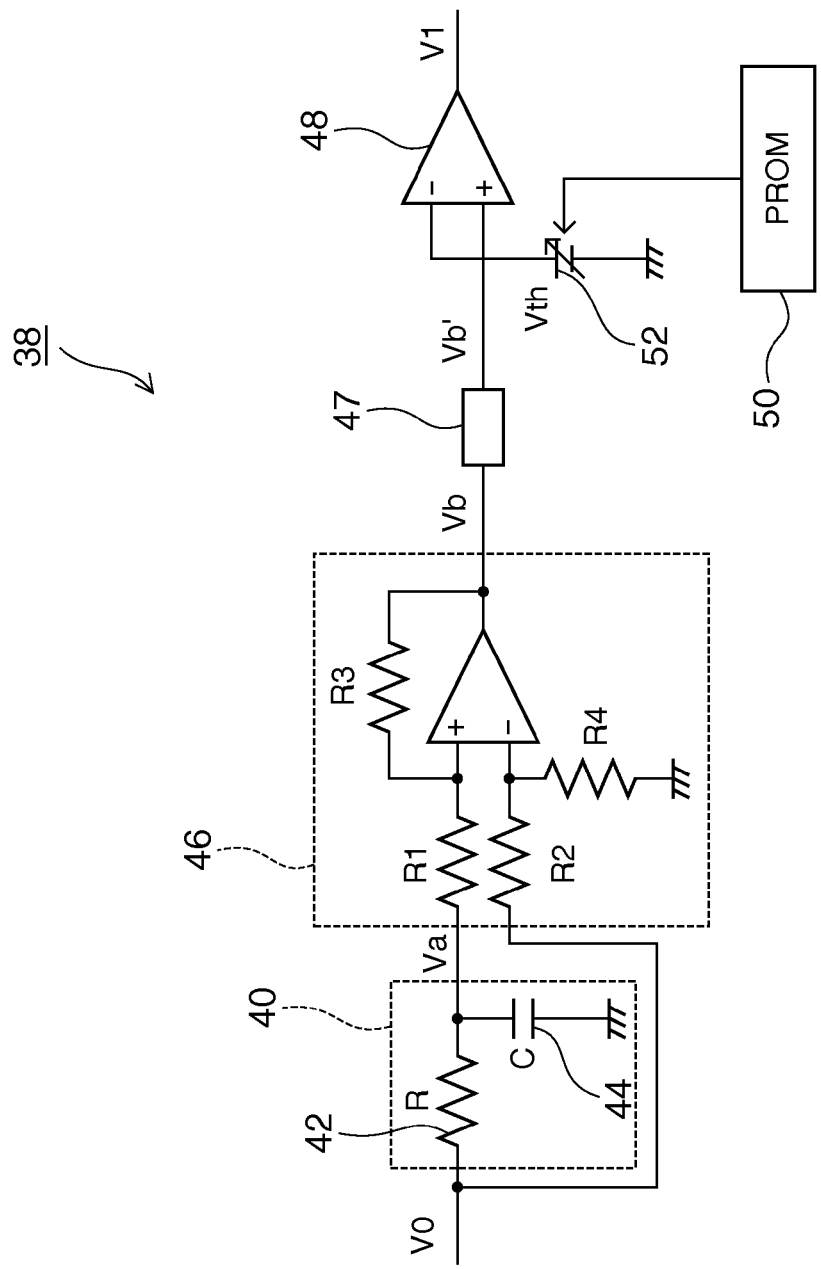
FIG. 5 is a circuit diagram of a signal generation circuit according to the present embodiment.

FIG. 5 is a circuit diagram of the signal generation circuit according to the present embodiment. As shown in FIG. 5, the signal generation circuit 38 has a low-pass filter 40, a differential amplifier circuit 46, an absolute value circuit 47, a comparator 48, and a voltage control section. The low-pass filter 40 is formed of, for example, a series circuit composed of a resistor 42 and a capacitor 44. Then, when the detected-temperature voltage (V0) is input to the series circuit, the electrical potential difference between the voltages respectively applied to both ends of the capacitor 44 is output as a signal (Va). The signal (Va) output from the low-pass filter 40 has a voltage delayed a certain period of time with respect to the voltage variation of the detected-temperature voltage (V0) according to the time constant corresponding to the capacitance of the capacitor 44.

The differential amplifier circuit 46 is for outputting a signal (Vb) obtained by performing differential amplification on the detected-temperature voltage (V0) and the signal (Va). Here, the detected-temperature voltage (V0), the signal (Va), and the signal (Vb) have the following relationship.

$$Vb = \frac{R2}{R1}(V0 - Va)$$

Therefore, the signal (Vb) is obtained by calculating the difference between the present detected-temperature voltage (V0) as real-time temperature information and the detected-temperature voltage (Va) a certain period of time before the present, and corresponds to the voltage variation of the detected-temperature voltage (V0). Further, the absolute value circuit 47 is connected to an output terminal of the differential amplifier circuit 46, and outputs the voltage representing the absolute value of the output voltage of the differential amplifier circuit 46. Therefore, it results that the absolute value circuit 47 outputs the signal (Vb') having the voltage corresponding to the voltage variation of the detected-temperature voltage (V0).

The comparator 48 is for outputting the signal (V1) representing the magnitude relation between the signal (Vb') and a threshold voltage (Vth) to be the reference voltage. Therefore, the threshold voltage (Vth) corresponds to the amplitude of the voltage variation in the detected-temperature voltage (V0) set previously. The comparator 48 outputs the signal (V1) with the voltage H if the signal Vb' has a voltage higher than Vth, and outputs the signal (V1) with the voltage L if the signal Vb' has a voltage lower than Vth.

The voltage control section is for controlling the threshold voltage Vth, and is composed of, for example, a programmable read only memory (PROM) 50 and a control power supply 52.

The control power supply 52 sets the threshold voltage Vth with a plurality of discrete voltage values, and each of the voltage values is made to correspond to the data stored in the PROM 50. Therefore, the control power supply 52 is capable of outputting the threshold voltage Vth to be a voltage value corresponding to the data read out from the PROM 50 to the comparator 48. Therefore, the voltage control section is capable of control the value of the threshold voltage Vth output by the control power supply 52 by changing the data stored in the PROM 50.

Therefore, the lower (higher) the threshold voltage Vth is set, the more (less) acutely the signal generation circuit 38 can respond to the temperature variation to output the signal (V1) with the voltage H. Further, by varying the capacitance of the capacitor 44, the delay time of the signal (Va) can be controlled.

Figure 6:
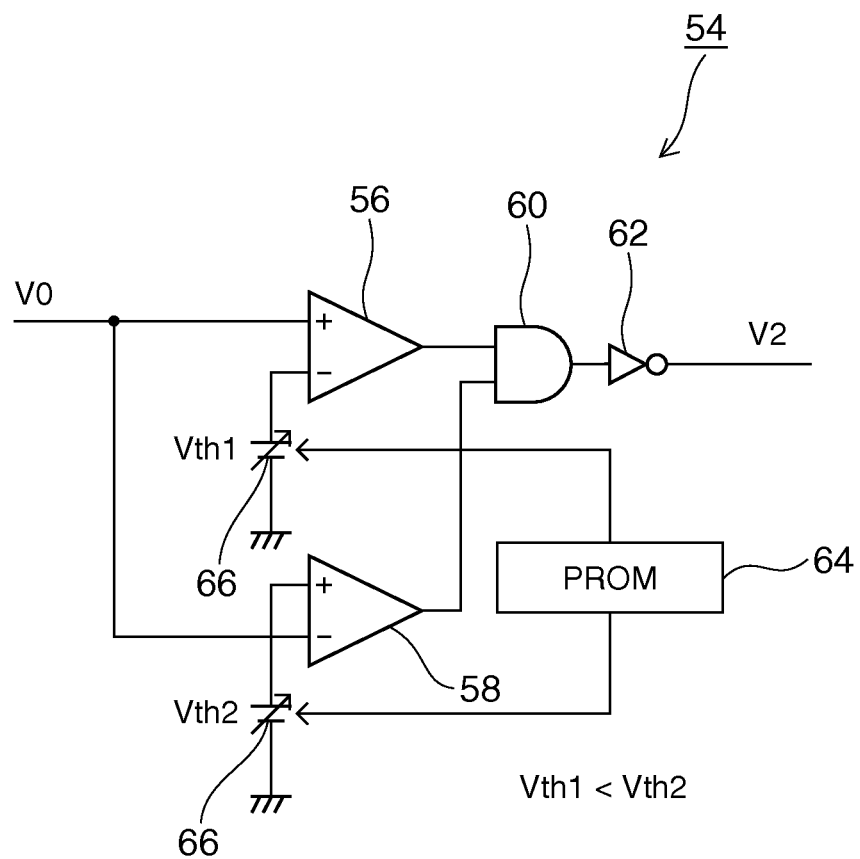
FIG. 6 is a circuit diagram of a blocking circuit according to the present embodiment.

FIG. 6 shows a circuit diagram of the blocking circuit according to the present embodiment. As shown in FIG. 6, the blocking circuit 54 is mainly composed of a comparator 56, a comparator 58, an AND circuit 60, a NOT circuit 62, and a voltage control section.

The comparator 56 is for outputting a signal representing the magnitude relation between the detected-temperature voltage (V0) and a first threshold voltage (Vth1). The comparator 56 outputs the voltage H if the detected-temperature voltage V0 has a voltage higher than the first threshold voltage Vth1, and outputs the voltage L if the detected-temperature voltage V0 has a voltage lower than the first threshold voltage Vth1.

The comparator 58 is for outputting a signal representing the magnitude relation between the detected-temperature voltage (V0) and a second threshold voltage (Vth2). The comparator 58 outputs the voltage L if the detected-temperature voltage V0 has a voltage higher than the second threshold voltage Vth2, and outputs the voltage H if the detected-temperature voltage V0 has a voltage lower than the second threshold voltage Vth2.

Further, the AND circuit 60 outputs a signal representing the AND result between the output of the comparator 56 and the output of the comparator 58, and the NOT circuit 62 outputs a signal (V2) obtained by inverting the output of the AND circuit 60.

The voltage control section is composed of a PROM 64 and a control power supply 66 (Vth1, Vth2) similarly to the above, and is set so that the second threshold voltage Vth2 is higher than the first threshold voltage Vth1.

Therefore, if the detected-temperature voltage (V0) is equal to or lower than the first threshold voltage Vth1, the comparator 56 outputs a signal with the voltage L, and the comparator 58 outputs a signal with the voltage H. Therefore, since the AND circuit 60 outputs a signal with the voltage L, the signal (V2) output by the NOT circuit 62 has the voltage H. Similarly, if the detected-temperature voltage (V0) is equal to or higher than the second threshold voltage Vth2, the comparator 56 outputs a signal with the voltage H, and the comparator 58 outputs a signal with the voltage L. Therefore, since the AND circuit 60 outputs a signal with the voltage L, the signal (V2) output by the NOT circuit 62 has the voltage H.

In contrast, if the detected-temperature voltage (V0) is in between the first threshold voltage Vth1 and the second threshold voltage Vth2, the comparator 56 outputs a signal with the voltage H, and the comparator 58 outputs a signal with the voltage H. Therefore, since the AND circuit 60 outputs a signal with the voltage H, the signal (V2) output by the NOT circuit 62 has the voltage L.

In the frequency-temperature characteristic of the piezoelectric resonator 14, there exists an area (the area corresponding to an extremal value of the frequency-temperature characteristic curve and the temperature range in the vicinity thereof, where the variation in the frequency-temperature characteristic in the temperature range is within the stability of the frequency-temperature characteristic required for the temperature-compensated oscillator 10) where the frequency variation with respect to the temperature variation is extremely small. Therefore, since the update of the temperature compensation voltage is not required in the temperature range described above, it is unnecessary to drive the temperature compensation circuit. Further, as described above, the temperature sensor 20 has a tendency that the detected-temperature voltage (V0) decreases monotonically with the temperature rise in a linear function manner. Therefore, in the present embodiment, the first threshold voltage (Vth1) is set to the voltage corresponding to the temperature to be the upper limit of the temperature range described above, and the second threshold voltage (Vth2) is set to the voltage corresponding to the temperature to be the lower limit of the temperature range described above. By setting the first and second threshold voltages Vth1, Vth2 as described above, in the case in which the detected-temperature voltage (V0) output by the temperature sensor 20 is in the voltage range corresponding to the temperature range described above, the blocking circuit 54 can stop the power supply to the temperature compensation circuit 22 by blocking the signal (V1) of the signal generation circuit via the AND circuit 86. Thus, the power consumption of the temperature compensation circuit 22 can dramatically be reduced.

In the temperature-compensated oscillator 10 according to the present embodiment, a current of roughly 1 mA is consumed in total. In the current, one third of the total is consumed by the temperature compensation circuit 22, one third is consumed by the voltage-controlled oscillation circuit 12, and one third is consumed by the buffer 18. Therefore, by reducing the driving duration of the temperature compensation circuit 22, the power consumption of the whole temperature-compensated oscillator 10 can be reduced. It should be noted that although the power consumption increases since the output circuit 36 is used in the present embodiment, the total power consumption of the temperature-compensated oscillator 10 is not affected since the current used is in a degree of several tens of microamperes.

Incidentally, in the temperature-compensated oscillator 10 according to the present embodiment, the temperature compensation circuit 22 needs a predetermined period of time from when the power is applied by the switch circuit 24 to when the temperature compensation voltage is stably output. Therefore, if the switch 30 inside the sample-and-hold circuit 28 is connected in a condition in which the temperature compensation voltage is unstable, there might be the case in which an unstable temperature compensation voltage is output to the voltage-controlled oscillation circuit 12, and the oscillation signal is made unstable.

Further, if the output of the temperature compensation voltage from the temperature compensation circuit 22 stops in the state in which the switch 30 inside the sample-and-hold circuit 28 is in a connected state, the capacitor 32 inside the sample-and-hold circuit 28 is discharged, and therefore, it becomes difficult to hold an accurate temperature compensation voltage. Therefore, in the present embodiment, it is preferable that the switch 30 of the sample-and-hold circuit 28 is set to the connected state after a predetermined period of time has elapsed from the start-up of the temperature compensation circuit 22, and the power supply to the temperature compensation circuit 22 is stopped after the switch 30 inside the sample-and-hold circuit 28 is set to a disconnected state.

Therefore, in the present embodiment, in order to make it possible to perform the connection and the disconnection in the order described above, a time lag is provided between the first ON/OFF signal (SW1) output to the switch circuit 24 and the second ON/OFF signal (SW2) output to the sample-and-hold circuit 28 using the branch circuit 68 explained below. In other words, the time lag is provided between the timing of generating the ON signal of the first ON/OFF signal (SW1) and the timing of generating the ON signal of the second ON/OFF signal (SW2), and the time lag is also provided between the timing of generating the OFF signal of the first ON/OFF signal (SW1) and the timing of generating the OFF signal of the second ON/OFF signal (SW2).

Figure 7:
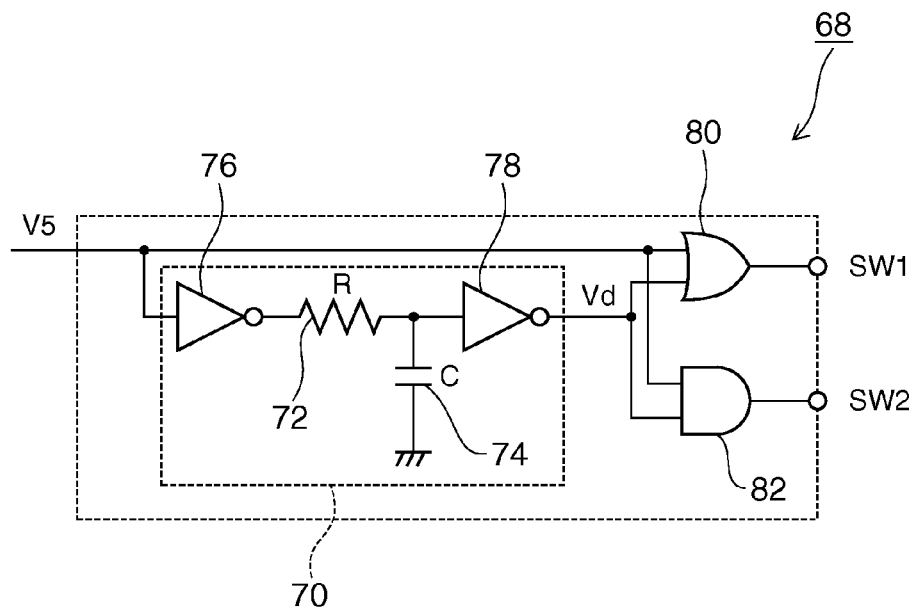
FIG. 7 is a circuit diagram and a time chart of a brunch circuit according to the present embodiment.
Figure 7:
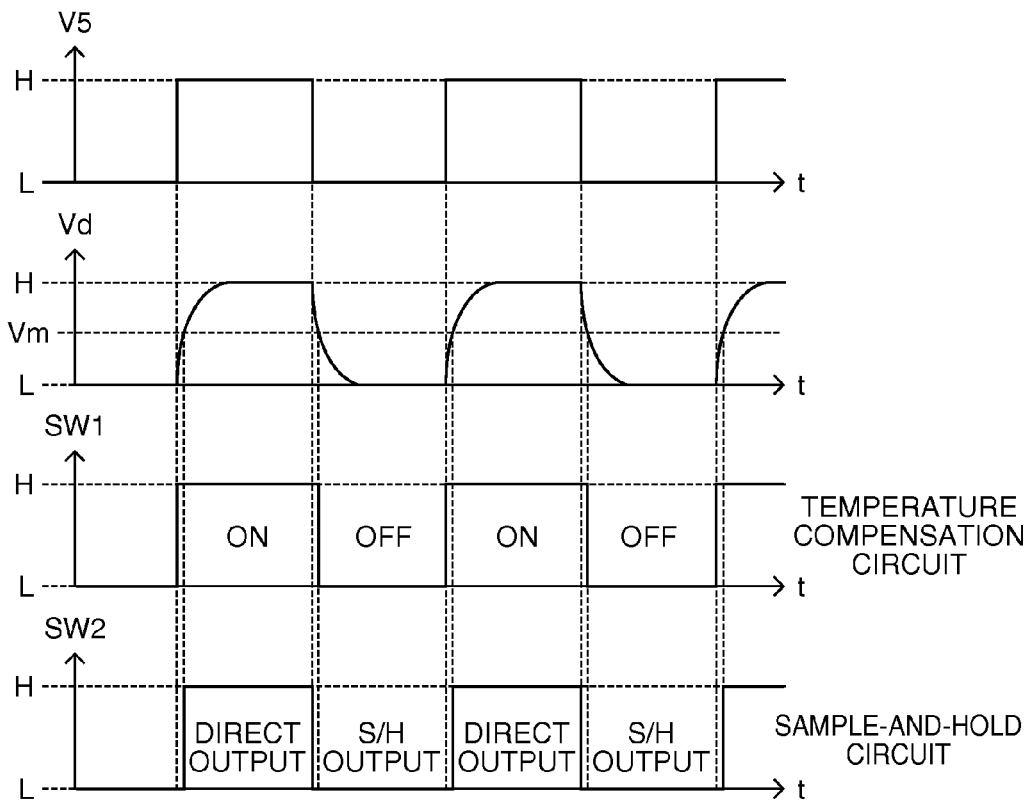

FIG. 7 shows a circuit diagram and a time chart of the brunch circuit according to the present embodiment. FIG. 7 describes the time chart of the case (e.g., alternately repeating the case in which the temperature variation increases and the case in which the temperature variation decreases) in which the signal (V5) repeats taking the voltage H and the voltage L alternately. As shown in FIG. 7, the brunch circuit 68 is mainly composed of a delay circuit 70, an OR circuit 80, and an AND circuit 82. The delay circuit 70 is formed by connecting buffers 76, 78 as inverter circuits respectively to an input side and an output side of a low-pass filter composed of a resistor 72 (R) and a capacitor 74 (C). Here, when the signal (V5) has the voltage L, the output of the buffer 76 has the voltage H, and the capacitor 74 is charged, and the voltage of the output of the buffer 78, namely the delay signal (Vd) is set to L. Further, when the signal (V5) has the voltage H, the output of the buffer 76 has the voltage L, and the capacitor 74 is discharged, and the voltage of the output of the buffer 78, namely the delay signal (Vd) is set to H.

Then, when the voltage of the signal (V5) rises from L to H, the capacitor 74 is discharged in accordance with the time constant corresponding to the capacitance of the capacitor 74, and the voltage applied to the capacitor 74 converges to a low voltage (zero) with time. Thus, the voltage of the delay signal (Vd) rises from L and converges to H with a predetermined time delay. Further, when the voltage of the signal (V5) falls from H to L, the capacitor 74 is charged based on the time constant described above, and the voltage applied to the capacitor 74 converges to a predetermined voltage. Thus, the voltage of the delay signal (Vd) falls from H and converges to L with a predetermined time delay.

The OR circuit 80 is for outputting a signal representing the OR result between the signal (V5) and the delay signal (Vd) to the switch circuit 24 as the first ON/OFF signal (SW1). It is assumed that the OR circuit 80 recognizes the voltage L of the signal (V5) as the voltage L, and recognizes the voltage H of the signal (V5) as the voltage H. On the other hand, the OR circuit 80 is adjusted so as to recognize the voltage of the delay signal (Vd) as the voltage H if the voltage of the delay signal (Vd) exceeds the voltage Vm between the voltage H and the voltage L of the delay signal (Vd), for example, the voltage Vm corresponding to ((voltage H)+(voltage L))/2, and to recognize the voltage of the delay signal (Vd) as the voltage L if the voltage of the delay signal (Vd) becomes lower than the voltage Vm.

The OR circuit 80 outputs the first ON/OFF signal (SW1) with the voltage H if it recognizes the voltage of either one of the signal (V5) and the delay signal (Vd) as the voltage H. Therefore, if the voltage of the signal (V5) rises from L to H, since the OR circuit 80 recognizes the voltage of the signal (V5) as the voltage H at the same time as the voltage of the signal (V5) rises to H, the first ON/OFF signal (SW1) with the voltage H can be output.

On the other hand, if the voltage of the signal (V5) falls from H to L, the OR circuit 80 recognizes the voltage of the signal (V5) as the voltage L at the same time as the voltage of the signal (V5) falls to L. However, the OR circuit 80 recognizes the voltage of the delay signal (Vd) as the voltage H until the voltage of the delay signal (Vd) becomes equal to or lower than the voltage Vm, and therefore, continuously outputs the first ON/OFF signal (SW1) with the voltage H. Then, the OR circuit 80 recognizes the voltage of the delay signal (Vd) as the voltage L after the voltage of the delay signal (Vd) becomes equal to or lower than the voltage Vm, and thus can output the first ON/OFF signal (SW1) with the voltage L.

The AND circuit 82 is for outputting a signal representing the AND result between the signal (V5) and the delay signal (Vd) to the sample-and-hold circuit 28 as the second ON/OFF signal (SW2). It is assumed that the AND circuit 82 recognizes the voltage L of the signal (V5) as the voltage L, and recognizes the voltage H of the signal (V5) as the voltage H. On the other hand, the AND circuit 82 is adjusted so as to recognize the voltage of the delay signal (Vd) as the voltage H if the voltage of the delay signal (Vd) exceeds the voltage Vm between the voltage H and the voltage L of the delay signal (Vd), for example, the voltage Vm corresponding to ((voltage H)+voltage L))/2, and to recognize the voltage of the delay signal (Vd) as the voltage L if the voltage of the delay signal (Vd) becomes lower than the voltage Vm.

The AND circuit 82 outputs the second ON/OFF signal (SW2) with the voltage H if it recognizes both of the voltages of the signal (V5) and the delay signal (Vd) as the voltage H. Therefore, if the voltage of the signal (V5) rises from L to H, the AND circuit 82 recognizes the voltage of the signal (V5) as the voltage H at the same time as the voltage of the signal (V5) rises to H. However, the AND circuit 82 recognizes the voltage of the delay signal (Vd) as the voltage L until the voltage of the delay signal (Vd) becomes equal to or higher than the voltage Vm, and therefore outputs the second ON/OFF signal (SW2) with the voltage L. Then, the AND circuit 82 recognizes the voltage of the delay signal (Vd) as the voltage H after the voltage of the delay signal (Vd) becomes equal to or higher than the voltage Vm, and thus can output the second ON/OFF signal (SW2) with the voltage H.

On the other hand, if the voltage of the signal (V5) falls from H to L, the AND circuit 82 recognizes the voltage of the signal (V5) as the voltage L at the same time as the voltage of the signal (V5) falls to L, and therefore outputs the second ON/OFF signal (SW2) with the voltage L irrespective of the voltage of the delay signal (Vd).

By performing the control described above, it results that in the first ON/OFF signal (SW1) and the second ON/OFF signal (SW2) output from the brunch circuit 68, the first ON/OFF signal (SW1) rises ahead of the second ON/OFF signal (SW2), and falls in retard of the second ON/OFF signal (SW2). It should be noted that by changing the value of the voltage Vm and the capacitance of the capacitor 58, the time lag in each of the rising edge and the falling edge between the first ON/OFF signal (SW1) and the second ON/OFF signal (SW2) can be controlled.

Therefore, the switch circuit 24 controlled by the first ON/OFF signal (SW1), namely the temperature compensation circuit 22 on which the ON/OFF control is performed by the switch circuit 24, can be set to the ON state a predetermined time earlier than when the sample-and-hold circuit 28 controlled by the second ON/OFF signal (SW2) is set to the direct output state. Further, the temperature compensation circuit 22 can be set to the OFF state after the sample-and-hold circuit 28 is set to the sample-and-hold (S/H) output state.

Figure 8:
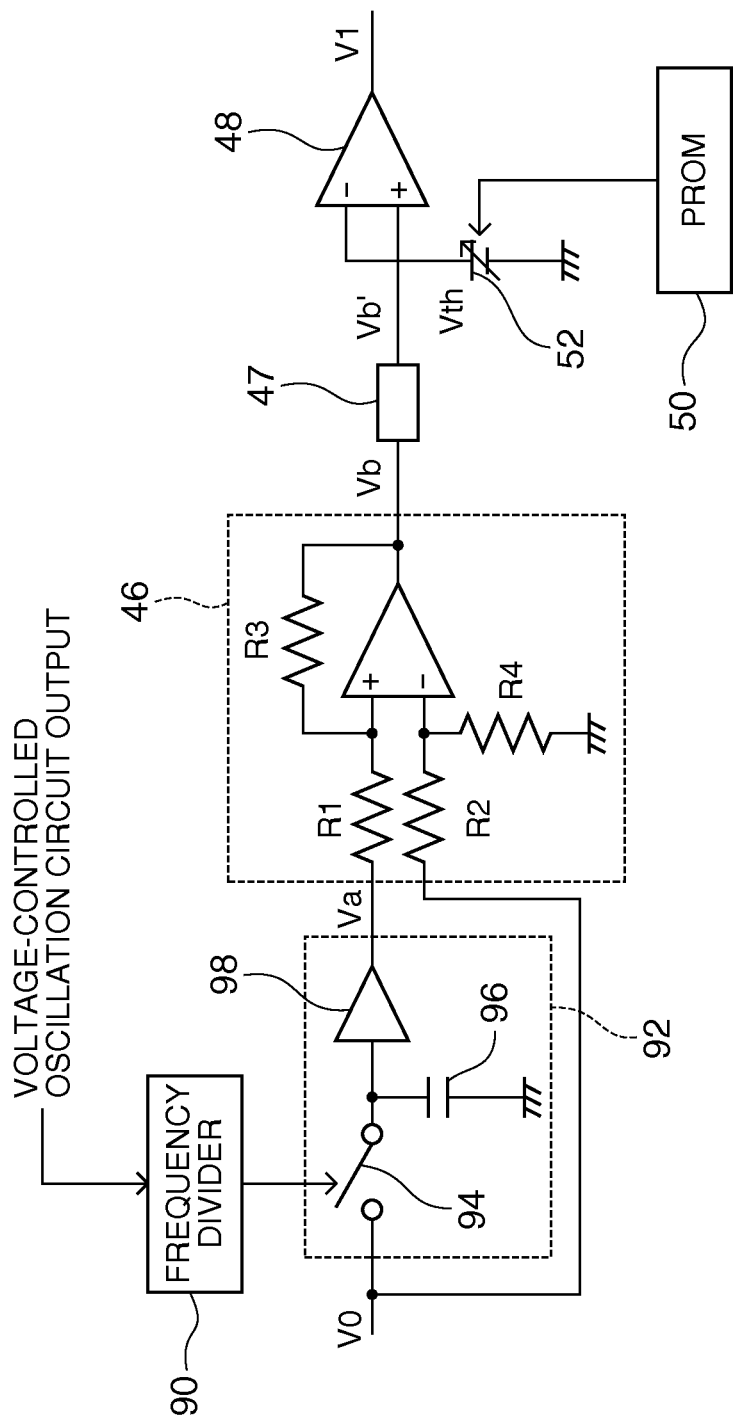
FIG. 8 is a circuit diagram of a modified example of the signal generation circuit according to the present embodiment.

FIG. 8 shows a circuit diagram of a modified example of the signal generation circuit according to the present embodiment. As a modified example of the signal generation circuit 38, a frequency divider 90 to be a timer, and a second sample-and-hold circuit 92 can be applied instead of the low-pass filter 40.

The frequency divider 90 is for outputting a pulse wave obtained by dividing the oscillation signal of the voltage-controlled oscillation circuit 12 as the drive signal. Although the drive signal is a signal repeatedly set to the state of the voltage H and the state of the voltage L alternately, it is assumed that the duration of the voltage H is sufficiently shorter than the duration of the voltage L.

The second sample-and-hold circuit 92 is composed of a switch 94, a capacitor 96, and a buffer 98 similarly to the sample-and-hold circuit 28. Further, the second sample-and-hold circuit 92 can be switched between a state (a direct output state) of outputting the detected-temperature voltage (V0) while connecting to the temperature sensor 20 to thereby hold the detected-temperature voltage (Va), and a sate (a sample-and-hold output state) of outputting the detected-temperature voltage (Va) thus held while cutting the connection to the temperature sensor 20 upon reception of the drive signal from the frequency divider 90.

The second sample-and-hold circuit 92 is switched to the direct output state while receiving the drive signal with the voltage H, and is switched to the sample-and-hold output state while receiving the drive signal with the voltage L. Then, in the direct output state of the second sample-and-hold circuit 92, the detected-temperature voltage (V0) and the detected-temperature voltage (Va) coincide with each other. In contrast, in the case in which the second sample-and-hold circuit 92 is in the sample-and-hold output state, and the temperature variation exists, the difference between the detected-temperature voltage (V0) and the detected-temperature voltage (Vc) held continues to increase until the subsequent drive signal with the voltage H comes in. Therefore, the differential amplifier circuit 46 connected to the second sample-and-hold circuit 92 can calculate the variation of the detected-temperature voltage (V0) for each period of the drive signal. Further, since the period of the frequency divider 90 can be selected by changing the setting thereof, the calculation interval of the temperature variation in the differential amplifier circuit 46 can arbitrarily be controlled in accordance with the period of the frequency divider.

Figure 9A:
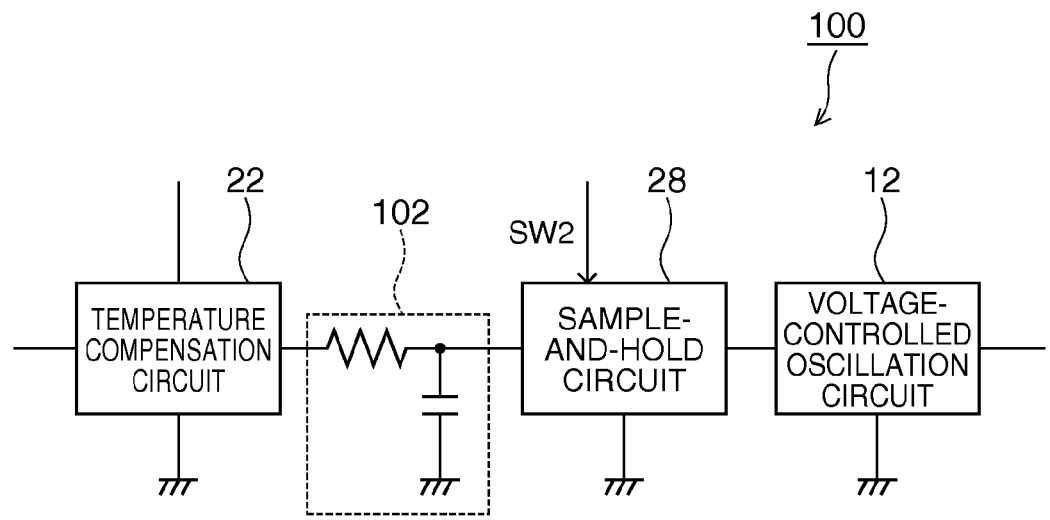
Figure 9B:
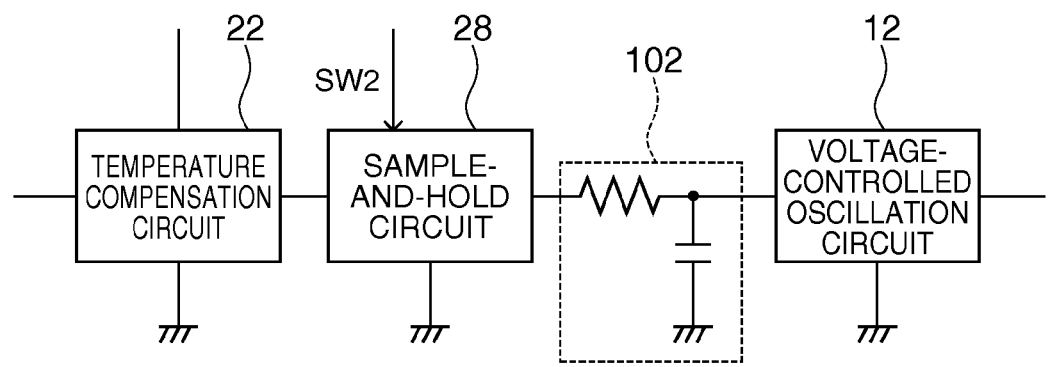

FIGS. 9A and 9B show a modified example of the temperature-compensated oscillator according to the present embodiment, wherein FIG. 9A shows a diagram having a low-pass filter disposed between the temperature compensation circuit and the sample-and-hold circuit, and FIG. 9B shows a diagram having a low-pass filter disposed between the sample-and-hold circuit and the voltage-controlled oscillation circuit.

The temperature-compensated oscillator 100 according to the modified example has a basic configuration common to the temperature-compensated oscillator according to the present embodiment and the temperature-compensated oscillator according to the modified example, but is different therefrom in the point that a second low-pass filter 102 is disposed at least one of between the temperature compensation circuit 22 and the sample-and-hold circuit 28, and between the sample-and-hold circuit 28 and the voltage-controlled oscillation circuit 12. The second low-pass filter 102 has substantially the same configuration as that of the low-pass filter 40. Further, although the second low-pass filter can be applied to either of the configurations shown in FIGS. 9A and 9B, by disposing the second low-pass filter in the posterior stage of the sample-and-hold circuit 28 as shown in FIG. 9B, the electrical noise generated in the switching control of the sample-and-hold circuit 28 can be reduced.

Figure 10:
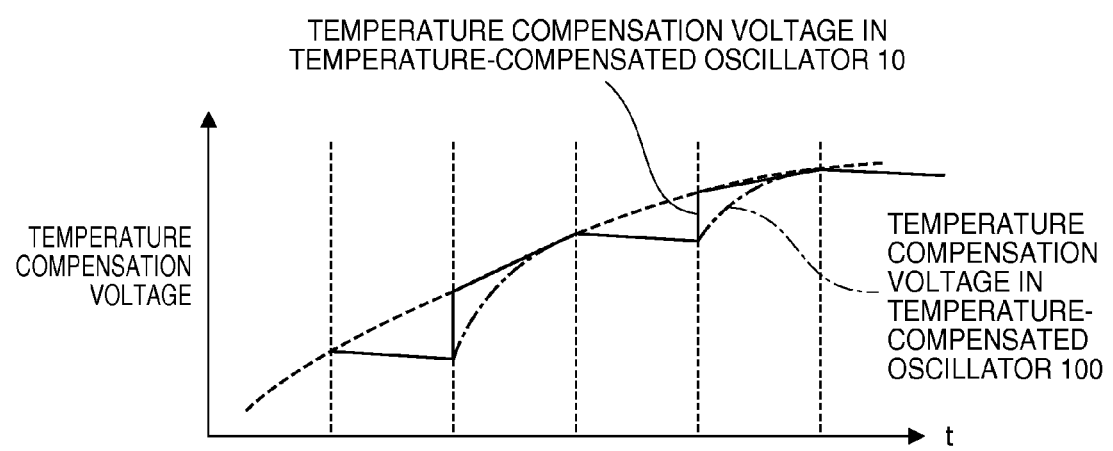
FIG. 10 is a diagram showing the time-dependency of the temperature compensation voltage of the temperature-compensated oscillator according to the present embodiment and the temperature-compensated oscillator of the modified example.
Figure 11:
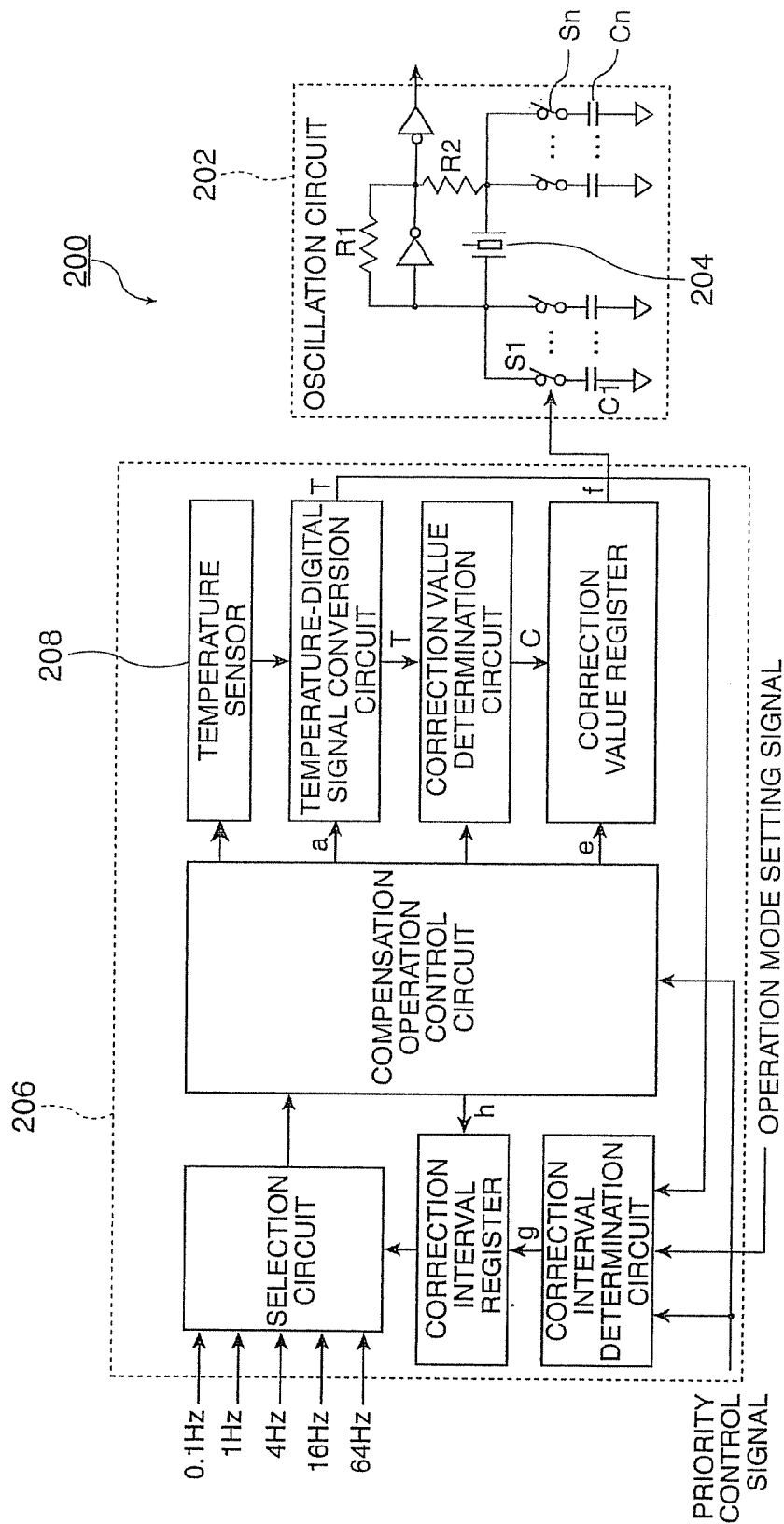
FIG. 11 is a block diagram of the temperature-compensated oscillator described in Document 1.

FIG. 10 shows time-dependency of the temperature compensation voltages of the temperature-compensated oscillator according to the present embodiment and the temperature-compensated oscillator according to the modified example. In FIG. 10, the case in which the ambient temperature of the temperature-compensated oscillators 10, 100 monotonically rises with time, and therefore, the temperature compensation voltage monotonically rises with time is considered. In the present embodiment, it results that the sample-and-hold circuit 28 switches from the temperature compensation voltage held to the temperature compensation voltage newly input from the temperature compensation circuit 22 immediately after setting the temperature compensation circuit 22 to the ON state. Therefore, the temperature compensation voltage becomes discontinuous in the time direction at the switching, which might exert a harmful influence to the voltage-controlled oscillation circuit 12. Therefore, by disposing the second low-pass filter 102 as the temperature-compensated oscillator 100 according to the modified example, the time variation in the temperature compensation voltage newly input thereto is made gentle to thereby make it possible to reduce the load on the voltage-controlled oscillation circuit 12. It should be noted that the reason that the temperature compensation voltage drops when the sample-and-hold circuit 28 is in the sample-and-hold (S/H) output state is that the capacitor 30 inside the sample-and-hold circuit 28 is discharged.

It should be noted that in either of the embodiments, if the time period from when the temperature compensation circuit 22 is started up to when the temperature compensation circuit 22 becomes stable is extremely short, and the capacitance of the capacitor 32 of the sample-and-hold circuit 28 is sufficiently large, the brunch circuit 68 described above can be eliminated. Further, in either of the embodiments, the temperature-compensated oscillator can be installed in a GPS receiver, a cellular phone, and so on, and it is possible to constitute an electronic device allowing reduction of power consumption while keeping the accurate temperature compensation. Further, in the case in which the frequency-temperature characteristic curve has a plurality of extremals in the piezoelectric resonator used in the voltage-controlled oscillation circuit, it is possible to determine which one of the extremals is included in the use temperature range, and then perform the rewriting of the data of the PROM 64 for outputting the first threshold voltage and the second threshold voltage used in the blocking circuit 54 in accordance with the use temperature.

The entire disclosure of Japanese Patent Application No. 2011-108762, filed May 13, 2011 is expressly incorporated by reference herein.

What is claimed is:

1. A temperature-compensated oscillator comprising:
   a temperature sensor adapted to output a detected-temperature voltage corresponding to temperature;
   a temperature compensation circuit adapted to output a temperature compensation voltage based on the detected-temperature voltage;
   a voltage-controlled oscillation circuit adapted to output an oscillation signal on which temperature compensation is performed based on the temperature compensation voltage;
   an output circuit adapted to output an ON/OFF signal based on a magnitude relation between an amplitude of a voltage variation in the detected-temperature voltage in a desired period and a reference voltage;
   a switch circuit adapted to perform ON/OFF control on power supply to the temperature compensation circuit in response to the ON/OFF signal; and
   a sample-and-hold circuit controlled to be switched between
      a state of outputting the temperature compensation voltage to the voltage-controlled oscillation circuit while holding the temperature compensation voltage output by the temperature compensation circuit, and
      a state of outputting the temperature compensation voltage held to the voltage-controlled oscillation circuit while cutting the connection to the temperature compensation circuit in response to the ON/OFF signal.

2. The temperature-compensated oscillator according to claim 1, wherein
   the output circuit includes
      a low-pass filter to which the detected-temperature voltage is input,
      a differential amplifier circuit adapted to perform differential amplification on an output of the temperature sensor and an output of the low-pass filter to thereby output a voltage corresponding to the voltage variation,
      an absolute value circuit adapted to output a voltage representing an absolute value of an output of the differential amplifier circuit to thereby output a voltage corresponding to an amplitude of the voltage variation, and
      a comparator adapted to output a signal, which represents a magnitude relation between an output of the absolute value circuit and the reference voltage, as the ON/OFF signal.

3. The temperature-compensated oscillator according to claim 1, wherein
   the output circuit includes
      a timer adapted to output a drive signal at a constant period,
      a second sample-and-hold circuit which can be switched between a state of outputting the detected-temperature voltage while connecting to the temperature sensor, and holding the detected-temperature voltage, and a state of outputting the detected-temperature voltage held while cutting the connection with the temperature sensor,
      a differential amplifier circuit adapted to perform differential amplification on an output of the temperature sensor and an output of the second sample-and-hold circuit to thereby output a voltage corresponding to the voltage variation, an absolute value circuit adapted to output a voltage representing an absolute value of an output of the differential amplifier circuit to thereby output a voltage corresponding to an amplitude of the voltage variation, and a comparator adapted to output a signal, which represents a magnitude relation between an output of the absolute value circuit and the reference voltage, as the ON/OFF signal.

4. The temperature-compensated oscillator according to claim 2, wherein the output circuit includes a blocking circuit adapted to block the ON/OFF signal if the detected-temperature voltage is a value between a first threshold voltage previously set, and a second threshold voltage set previously and higher than the first threshold voltage.

5. The temperature-compensated oscillator according to claim 2, wherein the output circuit includes a delay circuit to which the ON/OFF signal is input, and which outputs a delay signal obtained by delaying a voltage variation in the ON/OFF signal, an OR circuit adapted to output a signal representing an OR result between the ON/OFF signal and the delay signal to the switch circuit as the ON/OFF signal, and an AND circuit adapted to output a signal representing an AND result between the ON/OFF signal and the delay signal to the sample-and-hold circuit as the ON/OFF signal.

6. The temperature-compensated oscillator according to claim 1, further comprising:

a second low-pass filter disposed one of between the temperature compensation circuit and the sample-and-hold circuit, and between the sample-and-hold circuit and the voltage-controlled oscillation circuit.

7. An electronic device comprising:

the temperature-compensated oscillator according to claim 1.

8. An electronic device comprising:

the temperature-compensated oscillator according to claim 2.

9. An electronic device comprising:

the temperature-compensated oscillator according to claim 3.

* * * * *